(12) United States Patent
Otani et al.

(10) Patent No.: US 6,498,380 B1
(45) Date of Patent: Dec. 24, 2002

(54) SUBSTRATE FOR PHOTOELECTRIC CONVERSION DEVICE, AND PHOTOELECTRIC CONVERSION DEVICE USING THE SAME

(75) Inventors: Tsuyoshi Otani; Yukio Sueyoshi; Akira Fujisawa; Masahiro Hirata; Akihiko Hattori, all of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/594,264

(22) Filed: Jun. 15, 2000

(30) Foreign Application Priority Data

Jun. 18, 1999 (JP) .............................. 11-173215
Mar. 22, 2000 (JP) ........................ 2000-080965

(51) Int. Cl.[7] ......................................... H01L 31/0232
(52) U.S. Cl. ......................................... 257/432; 257/72
(58) Field of Search ................................. 257/432, 433, 257/434, 435, 436, 438, 458; 429/111

(56) References Cited

U.S. PATENT DOCUMENTS

| | | | |
|---|---|---|---|
| 4,207,119 A | | 6/1980 | Tyan |
| 4,273,826 A | | 6/1981 | McCollister et al. |
| 4,371,740 A | | 2/1983 | Clem |
| 4,440,822 A | | 4/1984 | Gordon |
| 4,675,469 A | * | 6/1987 | Iida et al. ............ 136/259 |
| 4,732,621 A | | 3/1988 | Murata et al. |
| 4,808,462 A | | 2/1989 | Yaba et al. |
| 4,835,040 A | | 5/1989 | Callies et al. |
| 5,252,140 A | * | 10/1993 | Kobayashi et al. ...... 136/256 |
| 5,254,904 A | | 10/1993 | Van De Leest et al. |
| 5,350,644 A | * | 9/1994 | Graetzel et al. ........ 429/111 |
| 5,393,563 A | | 2/1995 | Ellis, Jr. |
| 5,463,057 A | * | 10/1995 | Graetzel et al. ........ 429/111 |
| 5,525,440 A | * | 6/1996 | Kay et al. ............ 205/162 |
| 5,811,191 A | | 9/1998 | Neuman |
| 5,964,962 A | * | 10/1999 | Sannomiya et al. ..... 136/256 |
| 6,362,414 B1 | | 3/2002 | Fujisawa et al. |

FOREIGN PATENT DOCUMENTS

| | | |
|---|---|---|
| DE | 3436618 | 10/1984 |
| EP | 0 309 902 | 4/1989 |
| EP | 0 597 490 | 5/1994 |
| EP | 0 782 975 | 7/1997 |
| EP | 1057796 | 12/2000 |
| EP | 1061586 | 12/2000 |
| JP | 60-77150 | 5/1985 |
| JP | 61-288473 | 12/1986 |
| JP | 2-503615 | 10/1990 |
| JP | 4-133360 | 5/1992 |
| JP | 5-157902 | 6/1993 |
| JP | 7-41337 | 1/1995 |
| JP | 7-29402 | 4/1995 |
| JP | 409199745-a | * 7/1997 |
| WO | 98/06675 | 2/1998 |

OTHER PUBLICATIONS

Sanyal et al., "Chemical Vapour Deposition of Hot End COatings on Glass from Stannic Chloride", Glass Technology, vol. 23, No. 6, pp. 271–276.

Ruzalowski et al., "Use of Multi Analytical Techniques to Confirm Improved Optical Modeling of SnO2: F Films by Atomic Force Microscopy and Spectroscopic Ellipsometry" J. Vac. Sci. Technol. B. 14(6), pp. 3436–3444.

\* cited by examiner

*Primary Examiner*—Fetsum Abraham
*Assistant Examiner*—Leonardo Andujor
(74) *Attorney, Agent, or Firm*—Merchant & Gould

(57) ABSTRACT

On a glass sheet, undercoating layers and a transparent conductive film containing tin oxide as the main component are formed in this order. The surface of the transparent conductive film is provided with roughness including convex portions and concave portions. The convex portions have a mean diameter in a range between 0.05 $\mu$m and 0.3 $\mu$m and include five convex portions or less with diameters of at least 0.5 $\mu$m per 100 $\mu$m$^2$ of the surface. On the transparent conductive film, a photovoltaic unit and a back electrode are formed, thus obtaining a photoelectric conversion device.

4 Claims, 3 Drawing Sheets

SUBSTRATE FOR PHOTOELECTRIC CONVERSION DEVICE, AND PHOTOELECTRIC CONVERSION DEVICE USING THE SAME

FIELD OF THE INVENTION

The present invention relates to a substrate for a photoelectric conversion device and a photoelectric conversion device using the same.

BACKGROUND OF THE INVENTION

In a photoelectric conversion device, a transparent conductor on which a transparent conductive film of tin oxide, ITO, or the like is formed on a glass surface is used as a substrate. As the transparent conductive film, a tin oxide film has been used widely. A silicon-based thin film photoelectric conversion device in which a silicon-based material is used for a photovoltaic layer has been receiving attention due to the low energy cost required for its manufacture.

The transparent conductive film for the thin film photoelectric conversion device is required to have a high transmittance (i.e. to introduce a larger quantity of light into a photovoltaic layer) and a low sheet resistance (i.e. to reduce the loss in leading out generated electricity). It has been known that to provide the surface of the transparent conductive film with proper roughness is effective in trapping light in the photovoltaic layer.

As a preferable example of the shapes of convex or concave portions of such a rough surface, for example, JP 61-288473 A discloses the shapes of convex portions with heights in the range between about 100 nm and 500 nm and intervals between respective convex portions in the range between about 200 nm and 1000 nm. Further, JP 2-503615 A discloses shapes of convex portions having diameters in the range between 0.1 $\mu$m and 0.3 $\mu$m and the ratio of height/diameter in the range between 0.7 and 1.2. JP 4-133360 A discloses shapes of convex portions having truncated pyramidal or pyramidal shapes with heights in the range between 100 nm and 300 nm and angles between their ridgelines and the line perpendicular to the substrate in the range between 30 and 50 degrees.

On the other hand, when using a transparent conductive film having convex portions with excessively large diameters due to large crystal grain sizes in general, the conversion efficiency of a thin film photoelectric conversion device decreases. It is conceivable that the decrease in such a characteristic is affected by the deterioration in a step coverage property by a photovoltaic layer on the transparent conductive film, the increase in light absorption at the interface between layers due to the deterioration in film quality of the photovoltaic layer, or the like. In addition, the increase in resistance due to poor junction between the photovoltaic layer and the transparent conductive film also is conceivable as one of the factors causing the performance deterioration.

As a means for observing the shapes of convex or concave portions in the transparent conductive film, a scanning electron microscope is used in general. When simply the shapes of individual convex or concave portions or the intervals therebetween are to be measured, they can be observed sufficiently by a scanning electron microscope. However, when the scanning electron microscope is used, a high magnification is required and therefore the surface condition of the film is evaluated over a small region (a square with about 1 to 2 $\mu$m side length) at any one time. It is difficult to obtain a precise distribution of the convex portions with large diameters from the evaluation over such a small region.

The present inventors confirmed that even in a transparent conductive film in which no convex portion with a large diameter was found by the observation over such a small region as described above, scattered convex portions with large diameters were found by an observation over a larger region in some cases. Such a surface condition also was confirmed in the transparent conductive films formed according to the methods described in the above-mentioned publications.

As described above, conventionally, no attention has been paid to providing the surface of a transparent conductive film with roughness capable of suppressing the deterioration in film quality of a photovoltaic layer while providing a light trapping effect.

SUMMARY OF THE INVENTION

The present invention is intended to provide a substrate for a photoelectric conversion device that enables the improvement in conversion efficiency by controlling the shapes of convex or concave portions of the surface of a transparent conductive film over a larger region than that in a conventional method. The present invention also is intended to provide a photoelectric conversion device using this substrate.

In order to achieve the aforementioned objects, a substrate for a photoelectric conversion device according to the present invention includes a glass sheet, an undercoating film formed on the glass sheet, and a transparent conductive film containing tin oxide as a main component formed on the undercoating film. The surface of the transparent conductive film has convex portions and concave portions. The convex portions have a mean diameter in a range between 0.05 $\mu$m and 0.3 $\mu$m and include five convex portions or less with diameters of at least 0.5 $\mu$m per 100 $\mu$m$^2$ of the surface. In this specification, the "main component" denotes a component accounting for at least 50wt. % of the whole amount.

According to the above-mentioned configuration, a suitable substrate for a photoelectric conversion device (a photovoltaic device) such as a thin film solar cell or the like can be provided. The above-mentioned shape of the surface is effective in trapping light and the surface does not include many convex portions with large diameters. Therefore, the deterioration in film quality of a photoelectric conversion layer or the like is suppressed, thus obtaining an excellent conversion function.

The present invention also provides a photoelectric conversion device using the aforementioned substrate. In this photoelectric conversion device, at least one photoelectric conversion unit and a back electrode are stacked in this order on the transparent conductive film of the above-mentioned substrate. This photoelectric conversion device is used with the glass sheet side positioned as a light incident side.

DETAILED DESCRIPTION OF THE INVENTION

Preferable embodiments of the substrate for a photoelectric conversion device according to the present invention are described as follows.

Figure 1:
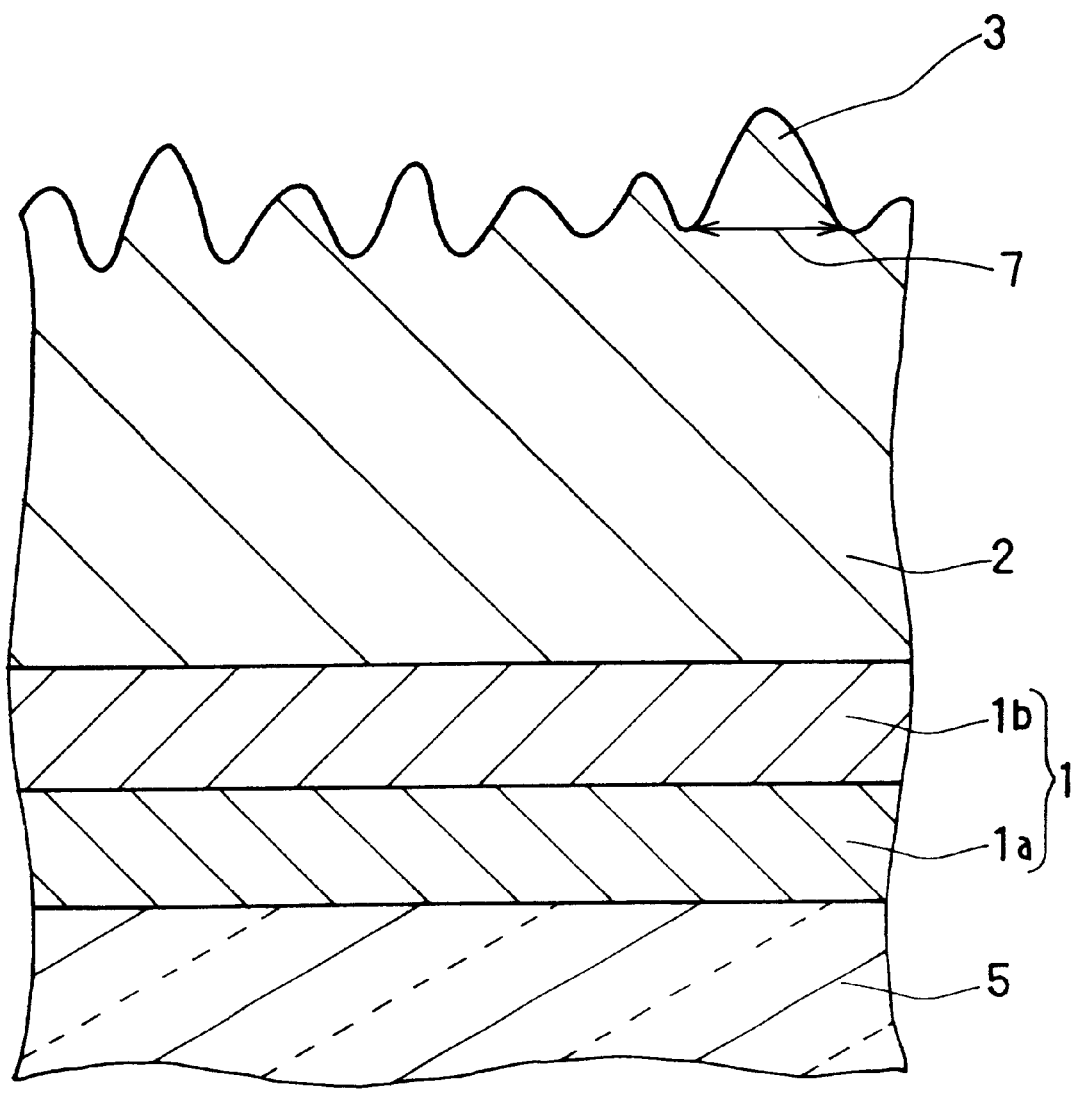
FIG. 1 is a sectional view of an embodiment of a substrate for a photoelectric conversion device according to the present invention.

FIG. 1 is a sectional view of an embodiment of the substrate for a photoelectric conversion device according to the present invention. In the substrate for a photoelectric conversion device of the present invention, an undercoating film 1 and a transparent conductive film 2 containing tin oxide as the main component are formed on a glass sheet 5 in this order, and convex and concave portions are formed at the surface of the transparent conductive film 2. These convex and concave portions contribute to the increase in the light trapping effect in a photovoltaic layer.

The undercoating film 1 affects the shapes and distribution of the concave and convex portions in the transparent conductive film. It is preferable that the undercoating film 1 contains, as the main component, at least one selected from silicon oxide and aluminum oxide and particularly is a silicon oxide film. The undercoating film may contain, as the main component, an oxide containing at least two metals such as, for example, tin-silicon oxide (SiSnO). Other preferable examples of the undercoating film include a film containing, as the main component, oxynitride or oxycarbide of the above-mentioned metals such as, for example, silicon oxycarbide (SiOC). When carbon or nitrogen is contained in an oxide, generally the refractive index of the oxide increases.

The undercoating film 1 is not particularly limited, but preferably is a two-layer film formed of a first undercoating layer 1a and a second undercoating layer 1b. In this case, it is preferable that the first undercoating layer 1a contains tin oxide as the main component. In addition, it is preferable that the second undercoating layer 1b contains, as the main component, at least one selected from silicon oxide and aluminum oxide, and more particularly a silicon oxide film.

The transparent conductive film 2 containing tin oxide as the main component is not particularly limited. However, it is preferable that the transparent conductive film 2 is a thin film containing, as the main component, tin oxide in which elements such as fluorine or the like are added in a predetermined amount to improve the conductivity.

Preferable thicknesses of the respective films are, for example:

the first undercoating layer 1a: between 0 nm and 85 nm,
the second undercoating layer 1b: between 10 nm and 70 nm, and
the transparent conductive film 2: between 400 nm and 1200 nm (particularly, between 500 nm and 1200 nm).

As shown in FIG. 1, at the surface of the transparent conductive film 2, a number of convex and concave portions are present. These convex and concave portions provide the light trapping effect with respect to incident light on the glass sheet side. The range of distribution in size of the convex and concave portions also is reduced compared to a conventional one. The number of large convex portions 3 having diameters 7 of at least 0.5 $\mu$m is limited within the above-mentioned range. In order to reduce the number of such large convex portions 3, generally, it is advantageous to employ a higher formation temperature for the transparent conductive film and a lower fluorine concentration in the transparent conductive film. A preferable fluorine concentration in the transparent conductive film is in the range between 0.05 and 0.15 wt. %.

The method of manufacturing the substrate for a photoelectric conversion device in which the convex and concave portions of the transparent conductive film are controlled as described above is not particularly limited. However, it is preferred to use a method of depositing the aforementioned respective films on the top surface of a glass ribbon sequentially by utilizing the heat of the glass ribbon in a float glass production process. The reasons are that the method is suitable for film formation under high temperatures and the heat of the glass ribbon can be utilized. Specifically, a spray pyrolysis in which a raw material liquid is atomized and then is supplied to the glass ribbon surface or a chemical vapor deposition (CVD) method in which a raw material is evaporated and then is supplied to the glass ribbon surface can be utilized.

Figure 2:
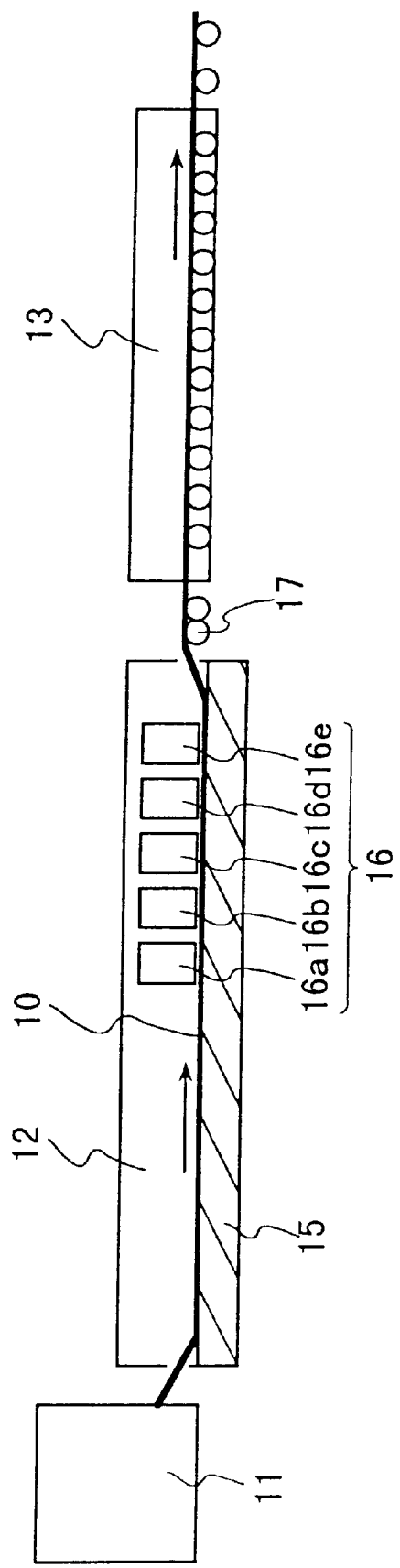
FIG. 2 is a view showing a configuration of a device used for manufacturing a substrate for a photoelectric conversion device according to the present invention.

FIG. 2 shows an embodiment of a device for depositing a thin film on a glass ribbon surface by the CVD method in a float glass process. As shown in FIG. 2, in this device, a predetermined number of coaters 16 (five coaters 16a, 16b, 16c, 16d, and 16e in the embodiment shown in the figure) are placed directly above a glass ribbon 10. The glass ribbon 10 is formed from molten glass, which flows into a float bath 12 from a furnace 11, in a belt-like form on a tin bath 15 while traversing the length of the float bath 12. The number and arrangement of the coaters are selected suitably depending on the kind and thickness of the coating film to be formed. These coaters supply materials (film deposition gasses), which have been prepared and evaporated, to form coating films on the glass ribbon 10 surface (the top surface, which is a surface not in contact with the tin bath) continuously.

By supplying different materials from the respective coaters, the first undercoating layer, the second undercoating layer, and the transparent conductive film can be stacked successively. In this case, it is preferable that the transparent conductive film deposited to be thicker than both the undercoating layers is deposited by using a plurality of coaters.

The temperature of the glass ribbon 10 is controlled by a heater and a cooler (not shown in the figure) installed inside the float bath 12 so that the glass ribbon 10 has a predetermined temperature directly before reaching the coater 16. In this case, it is preferable that the predetermined temperature of the glass ribbon is in the range between 600° C. and 750° C., further preferably between 630° C. and 750° C. Particularly, as the temperature of the glass ribbon 10 directly before reaching the coater used for forming the transparent conductive film, a temperature within the above-mentioned range is suitable. The glass ribbon 10 with the coating films thus formed is lifted by a roller 17 and then is annealed in an annealing furnace 13.

In the case of depositing thin films on a glass ribbon by the CVD method, it is preferred to control the concentrations of water vapor and oxygen in a film deposition gas (a mixed gas containing a tin material) to reduce large convex portions in the transparent conductive film. A suitable range of oxygen ($O_2$) is between 15 and 40, particularly between 25 and 40 when being indicated by a mole ratio ($O_2$/Sn) to tin (Sn). A suitable range of water vapor ($H_2O$) is between 15 and 30, particularly between 25 and 30 when being indicated by a mole ratio ($H_2O$/Sn) to tin (Sn).

The present invention includes a method of forming a transparent conductive film, which contains tin oxide as the main component and has a limited number of large convex portions as described above, on a glass sheet or a glass ribbon (preferably on a glass ribbon with a temperature in the range between 600° C. and 750° C.) on which an undercoating film is preformed as required, by thermally decomposing (pyrolyzing) a film formation gas. The film formation gas contains vapor of a tin compound (preferably an organic tin compound), oxygen, and water vapor, wherein a mole ratio of oxygen to one mole of tin atoms contained in the tin compound is in the range between 15 and 40 and a mole ratio of water vapor to the same is in the range between 15 and 30. The above-mentioned conditions of the film formation gas and temperature are preferable examples for carrying out the present invention, and the present invention is not limited to the aforementioned conditions.

In the case of forming thin films containing tin oxide as the main component by the CVD) method, examples of the tin material include monobutyltin trichloride (MBTC), tin tetrachloride, dimethyltin dichloride, dibutyltin dichloride, dioctyltin dichloride, tetramethyltin, or the like. As the tin material, an organic tin chloride such as monobutyltin trichloride (MBTC), dimethyltin dichloride (DMT), or the like is suitable. For the oxidation of the tin material, oxygen, water vapor, dry air, or the like can be used as an oxidation material. Examples of the fluorine material used when fluorine is added to the conductive film include hydrogen fluoride, trifluoroacetic acid, bromotrifluoromethane, chlorodifluoromethane, or the like.

In the case where a thin film containing silicon oxide as the main component is formed by the CVD method, examples of the silicon material include silane (monosilane), disilane, trisilane, monochlorosilane, 1,2-dimethylsilane, 1,1,2-trimethyldisilane, 1,1,2,2-tetramethyl disilane, tetramethyl orthosilicate, tetraethyl orthosilicate, or the like. In this case, oxidation materials include oxygen, water vapor, dry air, carbon dioxide, carbon monoxide, nitrogen dioxide, ozone, or the like. When a material with extremely high reactivity such as monosilane or the like is used, an unsaturated hydrocarbon gas such as ethylene, acetylene, toluene, or the like may be added to control the reactivity.

Besides the silicon oxide, examples of the aluminum material to be used when a film containing aluminum oxide as the main component, which is suitable as the second undercoating layer, is deposited by the CVD method include trimethylaluminum, aluminum triisopropoxide, diethylaluminum chloride, aluminum acetylacetonate, aluminum chloride, or the like. In this case, oxygen, water vapor, dry air, or the like can be used as an oxidation material.

Figure 3:
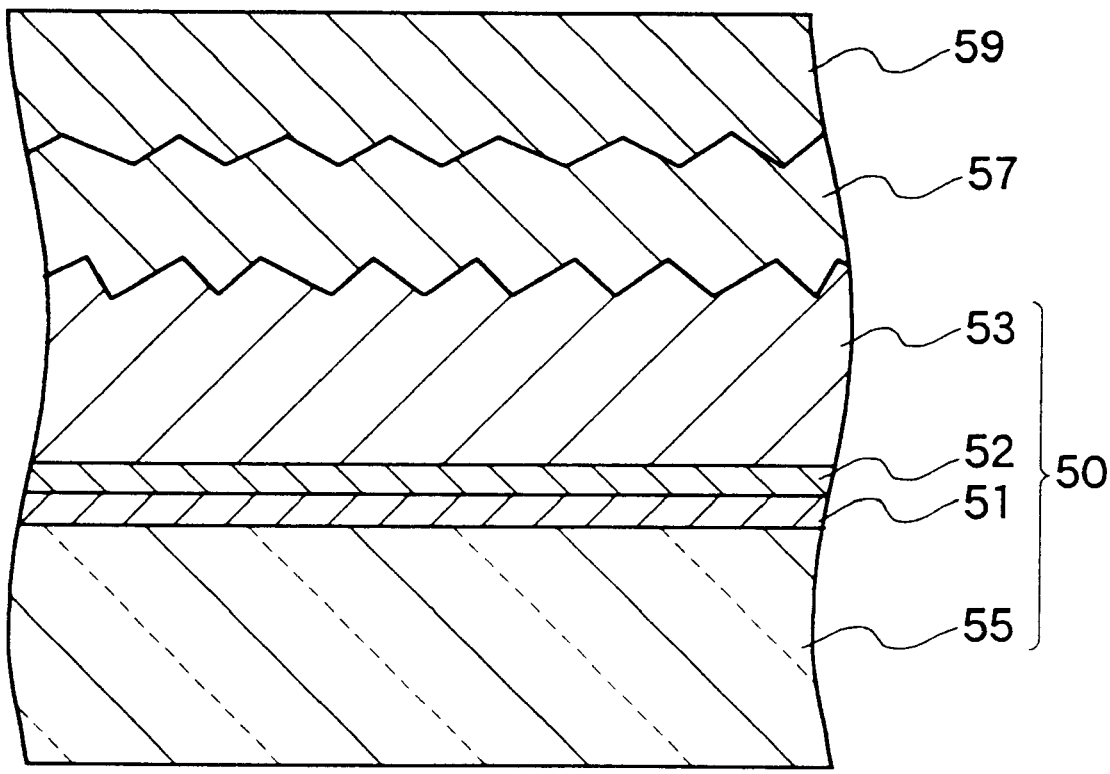
FIG. 3 is a sectional view of an embodiment of a photoelectric conversion device according to the present invention.

FIG. 3 shows a sectional view of an embodiment of a photoelectric conversion device of the present invention in which a silicon-based photovoltaic layer is formed on the substrate for a photoelectric conversion device described above.

In this thin film silicon-based photoelectric conversion device, on a substrate 50 for a photoelectric conversion device in which an undercoating film (first and second undercoating layers 51 and 52) and a transparent conductive film 53 are formed on a glass sheet 55 in this order, a photovoltaic unit 57 is formed and further a back electrode 59 is formed thereon.

The photovoltaic unit may be formed of a single layer as shown in the figure, but also may be formed by stacking a plurality of layers. Examples of the photovoltaic unit include a unit in which an amorphous silicon-based thin film or a crystalline silicon-based thin film is used as a photovoltaic layer (hereinafter the respective units are indicated by referring to the kind of the photovoltaic layer, such as "an amorphous silicon-based thin film photovoltaic unit" and "a crystalline silicon-based thin film photovoltaic unit").

An amorphous silicon-based thin film photovoltaic unit is formed by depositing respective p-type, i-type, and n-type semiconductor layers in this order by a plasma CVD method. Specifically, for example, it may be formed by depositing a p-type microcrystalline silicon-based layer doped with at least 0.01 atom % boron as an impurity atom determining its conductive type, an intrinsic amorphous silicon layer to be a photovoltaic layer, and an n-type microcrystalline silicon-based layer doped with at least 0.01 atom % phosphorus as an impurity atom determining its conductive type in this order. However, these respective layers are not limited to those mentioned above. For instance, the impurity atom in the p-type microcrystalline silicon-based layer may be aluminum or the like, and an amorphous silicon-based layer may be used as the p-type layer. For the p-type layer, an alloy material of amorphous or microcrystalline silicon carbide, silicon germanium, or the like may be used.

It is preferable that the conductive type (p-type and n-type) microcrystalline silicon-based layers have a thickness in the range between 3 nm and 100 nm, further preferably between 5 nm and 50 nm.

It is preferable that the intrinsic amorphous silicon layer is formed by the plasma CVD method while the temperature of an undercoating is set to be 450° C. or lower. This layer is formed as a thin film of substantially an intrinsic semiconductor with a density of impurity atoms determining its conductive type of $1 \times 10^{18}$ cm$^{-3}$ or lower. It is preferable that the intrinsic amorphous silicon layer has a thickness in the range between 0.05 μm and 0.5 μm. However, in an amorphous silicon-based thin film photovoltaic unit, an amorphous silicon carbide layer (for instance, an amorphous silicon carbide layer formed of amorphous silicon containing 10 atom % carbon or less) or an amorphous silicon germanium layer (for example, an amorphous silicon germanium layer formed of amorphous silicon containing 30 atom % germanium or less) of an alloy material may be formed instead of the intrinsic amorphous silicon layer.

Similarly, a crystalline silicon-based thin film photovoltaic unit can be formed by depositing respective p-type, i-type, and n-type semiconductor layers in this order by the plasma CVD method following the same procedure as that used for the amorphous silicon-based thin film photovoltaic unit.

It is preferable that as the back electrode, at least one metallic layer formed of at least one material selected from Al, Ag, Au, Cu, Pt, and Cr is formed by sputtering or vapor deposition. In addition, a layer formed of conductive oxide such as ITO, $SnO_2$, ZnO, or the like may be formed between the photovoltaic unit and the metal electrode.

When the transparent conductive film has large convex portions, the film quality of the crystalline silicon-based thin film to be formed thereon tends to be deteriorated. Therefore, the present invention exhibits a greater effect in a photoelectric conversion device including a crystalline silicon-based thin film photovoltaic unit.

In the present specification, a material with a crystalline fraction in volume of at least 50% is taken as corresponding to a "crystalline" material even if amorphous portions are contained regionally. In addition to the amorphous or crystalline silicon, a semiconductor material containing at least 50 atom % silicon such as amorphous silicon germanium or the like also is considered as the "silicon-based" material.

EXAMPLE

The present invention is described further in detail using examples as follows, but is not limited by the following examples.

In the following examples, a device for depositing a film on a glass ribbon by the CVD method as described above was used. In depositing films, a mixed gas containing 98 vol.% nitrogen and 2 vol.% hydrogen was supplied inside a float bath, so that the pressure inside the bath was maintained to be slightly higher than that outside the bath. A soda-lime glass material melted in a furnace was poured into the float bath, which then was formed into a glass ribbon. On the surface of the glass ribbon, thin films were stacked as follows. The surface temperature of the glass ribbon was measured with a radiation thermometer.

Example 1

From a coater positioned on the furthest upstream side, a mixed gas containing dimethyltin dichloride (DMT) (vapor), oxygen, helium, and nitrogen was supplied. Then, from a coater on the downstream side, a mixed gas containing monosilane, ethylene, oxygen, and nitrogen was supplied. Subsequently, from coaters on the further downstream side, a mixed gas containing dimethyltin dichloride (vapor), oxygen, water vapor, nitrogen, and hydrogen fluoride was supplied. Thus, on the top surface of the glass ribbon, a tin oxide film with a thickness of about 30 nm, a silicon oxide film with a thickness of about 30 nm, and a fluorine-containing (doped) tin oxide film with a thickness of about 700 nm were stacked in this order, thus obtaining a sample.

In this case, the surface temperature of the glass ribbon directly before reaching the coater on the furthest upstream side was set to be 750° C., that before reaching the coaters for supplying the mixed gas for depositing the fluorine-containing tin oxide film was set to be 680° C., and that directly after passing the coaters was set to be 610° C. In addition, the mole ratio ($O_2$/Sn) of oxygen to one mole of tin atoms and the mole ratio ($H_2O$/Sn) of water vapor to one mole of tin atoms in the mixed gas for forming the fluorine-containing tin oxide film were set to be 26 and 18, respectively.

With respect to the surface of the transparent conductive film of the sample thus obtained, a square region with 10 $\mu$m side length (100 $\mu m^2$) was observed with a scanning probe microscope to find no convex portion with a diameter of at least 0.5 $\mu$m. In the above-mentioned region, the mean diameter of all convex portions was 0.1 $\mu$m. In addition, the fluorine concentration in the film was calculated from the intensity of X-rays of an electron probe microanalyser and was 0.06 wt. %.

Example 2

From a coater on the furthest upstream side, a mixed gas containing dimethyltin dichloride (vapor), oxygen, helium, and nitrogen was supplied. Then, from a coater on the downstream side, a mixed gas containing monosilane, ethylene, oxygen, and nitrogen was supplied. From a coater on the further downstream side, a mixed gas containing dimethyltin dichloride (vapor), oxygen, water vapor, nitrogen, and hydrogen fluoride was supplied. Then, from a coater on the further downstream side, a mixed gas containing dimethyltin dichloride (vapor), oxygen, water vapor, and nitrogen was supplied. Subsequently, from a coater on the further downstream side, a mixed gas containing dimethyltin dichloride (vapor), oxygen, water vapor, nitrogen, and hydrogen fluoride was supplied. Thus, on the top surface of the glass ribbon, a tin oxide film with a thickness of about 30 nm, a silicon oxide film with a thickness of about 30 nm, a first fluorine-containing tin oxide film with a thickness of about 200 nm, a tin oxide film with a thickness of about 200 nm, and a second fluorine-containing tin oxide film with a thickness of about 200 nm were stacked in this order, thus obtaining a sample.

In this case, the surface temperature of the glass ribbon was set as in Example 1 (the surface temperature of the glass ribbon directly before reaching the coater used for forming the first fluorine-containing tin oxide film was set to be 680° C. and that directly after passing the coater used for forming the second fluorine-containing tin oxide film was set to be 610° C.). In addition, the mole ratios of $O_2$/Sn and $H_2O$/Sn in the mixed gases for depositing the first and second fluorine-containing tin oxide films were set to be 18 and 17, respectively.

With respect to the surface of the transparent conductive film of the sample thus obtained, a square region with 10 $\mu$m side length (100 $\mu m^2$) was observed with a scanning probe microscope to find three convex portions with diameters of at least 0.5 $\mu$m (i.e. three convex portions per 100 $\mu m^2$). In the above-mentioned region, the mean diameter of all convex portions was 0.1 $\mu$m. In addition, the fluorine concentration in the film was calculated as in the above and was 0.1 wt. %.

Example 3

From the coater on the furthest upstream side, a mixed gas containing monobutyltin trichloride (MBTC) (vapor), oxygen, helium, and nitrogen was supplied. Then, from a coater on the downstream side, a mixed gas containing monosilane, ethylene, oxygen, and nitrogen was supplied. Subsequently, from coaters on the further downstream side, a mixed gas containing dimethyltin dichloride (vapor), oxygen, water vapor, nitrogen, and trifluoroacetic acid was supplied. Thus, on the top surface of the glass ribbon, a tin oxide film with a thickness of about 65 nm, a silicon oxide film with a thickness of about 7 nm, and a fluorine-containing tin oxide film with a thickness of about 450 m were stacked in this order, thus obtaining a sample.

The temperature of the glass ribbon was set as in Example 1. In addition, the mole ratios of $O_2$/Sn and $H_2O$/Sn in the mixed gas for depositing the fluorine-containing tin oxide film were set to be 28 and 20, respectively.

With respect to the surface of the transparent conductive film of the sample thus obtained, a square region with 10 $\mu$m side length (100 $\mu m^2$) was observed with a scanning probe microscope to find no convex portions with a diameter of at least 0.5 $\mu$m. In the above-mentioned region, the mean diameter of all convex portions was 0.1 $\mu$m. In addition, the fluorine concentration in the film was calculated from the intensity of X-rays of an electron probe microanalyser and was 0.06 wt. %.

Example 4

From the coater on the furthest upstream side, no gas was supplied. From a coater on the downstream side, a mixed gas containing monosilane, ethylene, oxygen, and nitrogen was supplied. In this case, the rate of ethylene content was increased to introduce carbon into the film. Subsequently, from coaters on the further downstream side, a mixed gas containing dimethyltin dichloride (vapor), oxygen, water vapor, nitrogen, and trifluoroacetic acid was supplied. Thus, on the top surface of the glass ribbon, a silicon oxycarbide (SiOC) film with a thickness of about 60 nm and a fluorine-containing tin oxide film with a thickness of about 560 nm were stacked in this order, thus obtaining a sample.

Similarly in this example, the temperature of the glass ribbon was set as in Example 1. In addition, the mole ratios of $O_2$/Sn and $H_2O$/Sn in the mixed gas for depositing the fluorine-containing tin oxide film were set to be 26 and 16, respectively.

With respect to the surface of the transparent conductive film of the sample thus obtained, a square region with 10 μm side length (100 μm$^2$) was observed with a scanning probe microscope to find two convex portions with diameters of at least 0.5 μm. In the above-mentioned region, the mean diameter of all convex portions was 0.2 μm. In addition, the fluorine concentration in the film was calculated from the intensity of X-rays of an electron probe microanalyser and was 0.13 wt. %.

Example 5

From a coater on the furthest upstream side, a mixed gas containing monobutyltin trichloride (vapor), oxygen, helium, nitrogen, and tetraethoxysilane was supplied. Then, from a coater on the downstream side, a mixed gas containing tetraethoxysilane, monobutyltin trichloride (vapor), oxygen, and nitrogen was supplied. In this case, in the mixed gas supplied from the coater on the furthest upstream side, the ratio of monobutyltin trichloride and tetraethoxysilane was adjusted so that the film to be formed contained more tin atoms than silicon atoms. In the mixed gas supplied from the coater on the downstream side, the ratio of them was adjusted so that the film to be formed contained less tin atoms than silicon atoms. Subsequently, from coaters on the further downstream side, a mixed gas containing dimethyltin dichloride (vapor), oxygen, water vapor, nitrogen, and hydrogen fluoride was supplied. Thus, on the top surface of the glass ribbon, a tin-silicon oxide (SnSiO) film with a thickness of about 55 nm, a silicon-tin oxide (SiSnO) film with a thickness of about 35 nm, and a fluorine-containing tin oxide film with a thickness of about 480 nm were stacked in this order, thus obtaining a sample.

Similarly in this example, the temperature of the glass ribbon was set as in Example 1. In addition, the mole ratios of $O_2$/Sn and $H_2O$/Sn in the mixed gas for depositing the fluorine-containing tin oxide film were set to be 22 and 25, respectively.

With respect to the surface of the transparent conductive film of the sample thus obtained, a square region with 10 μm side length (100 μm$^2$) was observed with a scanning probe microscope to find no convex portions with a diameter of at least 0.5 μm. In the above-mentioned region, the mean diameter of all convex portions was 0.1 μm. In addition, the fluorine concentration in the film was calculated from the intensity of X-rays of an electron probe microanalyser and was 0.09 wt. %.

Comparative Example 1

A soda-lime glass sheet with a thickness of 1.1 mm and a size of 100 mm×100 mm was washed and then was dried, thus obtaining a substrate. This substrate was introduced into an atmosphere pressure CVD furnace to be heated to 580° C. On its surface, a mixed gas containing monosilane, oxygen, and nitrogen was supplied to form a silicon oxide film with a thickness of about 80 nm. Further, a mixed gas containing tin tetrachloride, water, methyl alcohol, nitrogen, and hydrogen fluoride was supplied to form a fluorine-containing tin oxide film with a thickness of about 700 nm on the surface of the silicon oxide film, thus obtaining a sample. The mole ratios of $O_2$/Sn and $H_2O$/Sn in the mixed gas for depositing the fluorine-containing tin oxide film were set to be 18 and 14, respectively.

With respect to the surface of the transparent conductive film of the sample thus obtained, a square region with 10 μm side length (100 μm$^2$) was observed with a scanning probe microscope to find eight convex portions with diameters of at least 0.5 μm. In the above-mentioned region, the mean diameter of all convex portions was 0.4 μm. In addition, the fluorine concentration in the film was calculated as in the above and was 0.25 wt. %.

Comparative Example 2

A sample was obtained as in Example 1 except that the mole ratios of $O_2$/Sn and $H_2O$/Sn in the mixed gas for depositing the fluorine-containing tin oxide film were set to be 5 and 10, respectively.

With respect to the surface of the transparent conductive film of the sample thus obtained, a square region with 10 μm side length (100 μm$^2$) was observed with a scanning probe microscope to find seven convex portions with diameters of at least 0.5 μm. In the above-mentioned region, the mean diameter of all convex portions was 0.4 μm. In addition, the fluorine concentration in the film was calculated as in the above and was 0.12 wt. %.

Comparative Example 3

A sample was obtained as in Example 3 except that the mole ratios of $O_2$/Sn and $H_2O$/Sn in the mixed gas for depositing the fluorine-containing tin oxide film were set to be 8 and 16, respectively.

With respect to the surface of the transparent conductive film of the sample thus obtained, a square region with 10 μm side length (100 μm$^2$) was observed with a scanning probe microscope to find ten convex portions with diameters of at least 0.5 μm. In the above-mentioned region, the mean diameter of all convex portions was 0.3 μm. In addition, the fluorine concentration in the film was calculated as in the above and was 0.20 wt. %.

Example 6

Using the glass sheet with the transparent conductive film according to Example 1 as a substrate, an amorphous silicon photovoltaic unit was formed by the plasma CVD method, thus obtaining a thin film photoelectric conversion device. In the pin junction included in the amorphous silicon photovoltaic unit, a p-type amorphous silicon carbide layer and an n-type amorphous silicon layer were used and had thicknesses of 15 nm and 30 nm, respectively. An intrinsic amorphous silicon layer (i-type) was formed by a RF plasma CVD method. As film deposition conditions, a reaction gas of silane, a pressure inside a reaction chamber of about 40 Pa, a RF power density of 15 mW/cm$^2$, and a film deposition temperature of 150° C. were used. An intrinsic amorphous silicon film deposited directly on a glass substrate to have a thickness of 300 nm under the same film deposition conditions as those described above had a dark conductivity of 5×10$^{-10}$ S/cm. The thickness of the intrinsic amorphous silicon layer was set to be 300 nm. Finally, as a back electrode, an ITO film with a thickness of 80 nm and an Ag film with a thickness of 300 nm were deposited in this order by sputtering.

The output characteristics of the thin film photoelectric conversion device (with a photovoltaic area of 1 cm$^2$) thus produced were measured while light of AM1.5 (100 mW/cm$^2$) was irradiated as incident light. The results included an open circuit voltage of 0.89V, a short-circuit current density of 16.0 mA/cm$^2$, a fill factor of 71.5%, and a conversion efficiency of 10.2%. Further, an optical degradation test was carried out by irradiating light of AM1.5 (100 mW/cm$^2$) at 48° C. After 550 hours irradiation, the conversion efficiency was degraded up to 8.3%.

As described above, according to the present invention, a substrate for a photoelectric conversion device that can be used suitably in a thin film photoelectric conversion device can be obtained. When this substrate is used, not only is the light trapping effect obtained, but also the excellent junction with the photovoltaic layer is secured due to fewer large convex portions. Thus, according to the present invention, the conversion efficiency of a photoelectric conversion device can be improved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A substrate for a photoelectric conversion device, comprising:

a glass sheet;

an undercoating film formed on the glass sheet; and a transparent conductive film containing tin oxide as a main component, which is formed on the undercoating film and has a surface provided with convex portions and concave portions, wherein the convex portions have a mean diameter in a range between 0.05 $\mu$m and 0.3 $\mu$m and include five convex portions or less with diameters of at least 0.5 $\mu$m per 100 $\mu$m$^2$ of the surface.

2. The substrate for a photoelectric conversion device according to claim 1, wherein the transparent conductive film contains fluorine and a concentration of the fluorine is in a range between 0.05 wt. % and 0.15 wt. %.

3. The substrate for a photoelectric conversion device according to claim 1, wherein the transparent conductive film has a thickness in a range between 400 nm and 1200 nm.

4. A photoelectric conversion device, comprising:

a substrate for a photoelectric conversion device according to claim 1;

at least one photoelectric conversion unit; and a back electrode, the at least one photoelectric conversion unit and the back electrode being stacked on the transparent conductive film of the substrate in this order.

* * * * *

UNITED STATES PATENT AND TRADEMARK OFFICE
CERTIFICATE OF CORRECTION

PATENT NO.    : 6,498,380 B1
DATED         : December 24, 2002
INVENTOR(S)   : Otani et al.

It is certified that error appears in the above-identified patent and that said Letters Patent is hereby corrected as shown below:

<u>Title page,</u>
Item [73], Assignee, after "Osaka (JP)" insert -- and Kaneka Corporation, Osaka (JP) --

Signed and Sealed this

Twenty-sixth Day of August, 2003

JAMES E. ROGAN
*Director of the United States Patent and Trademark Office*